(12) United States Patent
Senda et al.

(10) Patent No.: US 7,949,321 B2
(45) Date of Patent: May 24, 2011

(54) WIRELESS COMMUNICATION SYSTEM, WIRELESS COMMUNICATION APPARATUS, AMPLIFICATION FACTOR DETERMINATION METHOD, AND STORAGE MEDIUM

(75) Inventors: Mitsuharu Senda, Tokyo (JP); Masamitsu Nishikido, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 604 days.

(21) Appl. No.: 12/065,082

(22) PCT Filed: Aug. 29, 2006

(86) PCT No.: PCT/JP2006/316987
§ 371 (c)(1),
(2), (4) Date: Feb. 27, 2008

(87) PCT Pub. No.: WO2007/026699
PCT Pub. Date: Mar. 8, 2007

(65) Prior Publication Data
US 2009/0163153 A1 Jun. 25, 2009

(30) Foreign Application Priority Data
Aug. 29, 2005 (JP) .................. 2005-248471

(51) Int. Cl.
*H04B 1/06* (2006.01)
*H04B 1/16* (2006.01)
(52) U.S. Cl. .............. 455/232.1; 455/102; 455/205; 375/320; 375/322; 375/345
(58) Field of Classification Search .......... 455/102, 455/205, 232.1; 375/298, 302, 320, 322, 375/324, 345, 347
See application file for complete search history.

(56) References Cited

U.S. PATENT DOCUMENTS 4,617,536 A * 10/1986 Richard .................. 455/108
7,688,156 B2 * 3/2010 Matsuura et al. ........... 375/300

FOREIGN PATENT DOCUMENTS

| JP | 09-116589 | 5/1997 |
| JP | 2001-177426 | 6/2001 |
| JP | 2003078504 A | 3/2003 |
| JP | 2003-179660 | 6/2003 |

(Continued)

*Primary Examiner* — Quochien B Vuong
(74) *Attorney, Agent, or Firm* — DLA Piper LLP (US)

(57) ABSTRACT

The back-off of an AGC diversion section can be appropriately controlled. A base station apparatus (10) includes an amplifying part (12) for receiving a first transmission signal, which is generated by being modulated using a first modulation scheme and transmitted, and a second transmission signal, which is generated by being modulated using a second modulation scheme in which the maximum value of the amplitude of the transmission signal that is generated differs from that of the first modulation scheme, and which is transmitted following the first transmission signal, and amplifying these signals at a given amplification factor; a basic value determining part (14a) for determining a basic value that is used to determine the given amplification factor on the basis of the received power of the first transmission signal; an amplification factor correcting part (15) for acquiring correction data for the basic value, which is correction data that is determined on the basis of the amount of difference between the maximum values of the amplitudes of the transmission signals that are respectively generated using the first modulation scheme and second modulation scheme; and an amplification factor determining part (14) for determining the given amplification factor for the second transmission signal on the basis of the basic value and the correction data.

6 Claims, 5 Drawing Sheets

FOREIGN PATENT DOCUMENTS

| | | |
|---|---|---|
| JP | 2003-204364 | 7/2003 |
| JP | 2003-218727 | 7/2003 |
| JP | 2003258927 A | 9/2003 |
| JP | 2003347967 A | 12/2003 |
| JP | 2004363945 A | 12/2004 |
| JP | 2005210357 A | 8/2005 |

* cited by examiner

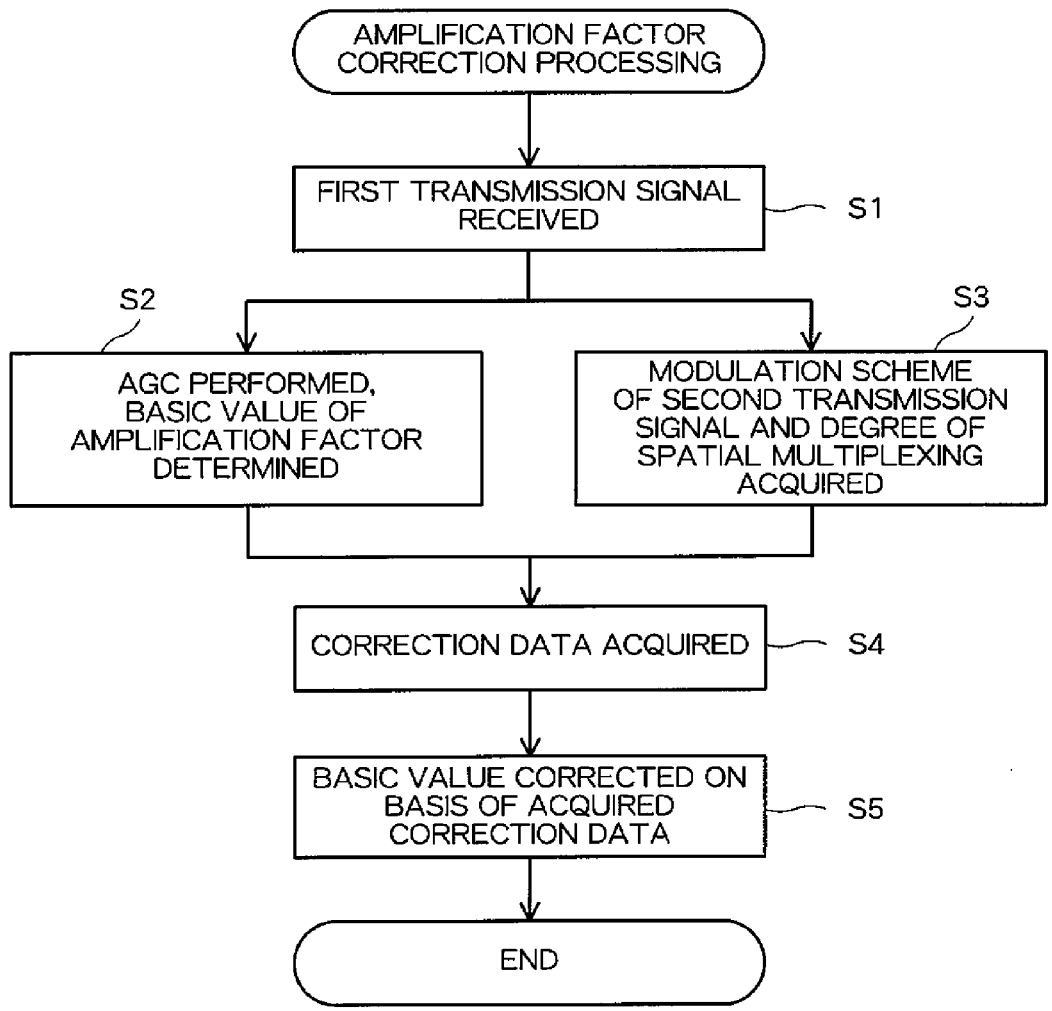

WIRELESS COMMUNICATION SYSTEM, WIRELESS COMMUNICATION APPARATUS, AMPLIFICATION FACTOR DETERMINATION METHOD, AND STORAGE MEDIUM

TECHNICAL FIELD

The present invention relates to a wireless communication system, a wireless communication apparatus, an amplification factor determination method, and a storage medium.

BACKGROUND ART

In mobile communication systems, AGC (automatic gain control) is generally performed when radio waves are received. An amplifier used to amplify the amplitude of received signals is contained in a communication apparatus; however, if the power of the received signals (received power) is too large, the amplifier becomes saturated, and distortion appears in the waveform. Accordingly, in mobile communication systems, the gain (amplification factor) of the amplifier is controlled by AGC, so that the amplified received power does not exceed the saturation power of the amplifier (i.e., the threshold power at which the amplifier becomes saturated).

Furthermore, an AGC in which the distribution of the gain of two stages of amplifiers (a low-noise amplifier and an intermediate-frequency amplifier) is determined on the basis of the modulation scheme of the received signals is disclosed in Japanese Laid-Open Patent Application No. 2003-204364.

DISCLOSURE OF THE INVENTION

Problem to be Solved by the Invention

When signals are transmitted, the communication apparatus transmits information to the communication counterpart using the modulated transmission signals. One scheme of this modulation (modulation scheme) is an amplitude variation type modulation scheme which transmits information according to differences in the amplitude of the transmission signal. Concrete examples of schemes of this type include an amplitude modulation scheme (ASK), an quadrature amplitude modulation scheme (QAM), and the like.

Furthermore, in mobile communication systems, a modulation scheme called a composite modulation scheme may be used. The term composite modulation scheme refers to a modulation scheme in which a plurality of modulation schemes are used within a single transmission frame; one example of such a modulation scheme is a modulation scheme in which a portion of the head of the frame is modulated using a differential encoding scheme that requires no reference signal point (e.g., $\pi/4$ shift QPSK), and the remainder of the frame is modulated using an absolute phase scheme (e.g., 16QAM) (this modulation scheme will hereafter be referred to as a "differential-absolute composite modulation scheme). In this differential-absolute composite modulation scheme, a predetermined modulation scheme is used for the differential encoding scheme section, while the modulation scheme of the absolute phase scheme section is adaptively determined by link adaptation in accordance with the received power or the like. On the receiving side, information indicating the modulation scheme of the absolute phase scheme section is transmitted in the differential encoding scheme section.

Generally, an amplitude variation type modulation scheme is not used in the differential encoding scheme section, and the amplitude of the transmission signal in the differential encoding scheme section is fixed. Utilizing this, AGC is performed in each frame in a mobile communication system using a composite modulation scheme. In other words the gain of the amplifier is determined in the differential encoding scheme section (AGC section) in the head of each frame, and the determined gain is also maintained in the absolute phase scheme section (AGC diversion section).

However, in this AGC, if the gain of the amplifier is simply determined on the basis of the received power of the AGC section, there is a danger that the amplifier will be saturated in the following AGC diversion section. The reason for this is that there are cases in which an amplitude variation type modulation scheme is used in the AGC diversion section, and in such a case, the received power of the AGC diversion section may be larger than the received power of the AGC section.

Accordingly, it is conceivable that the gain might be determined beforehand with a surplus amount of gain so that the amplifier will not become saturated even if a transmission signal modulated using a modulation scheme in which the maximum amplitude of the transmission signal obtained as a result of modulation shows a maximum among the modulation schemes that might be used (maximum amplitude generating modulation scheme) is received. If this is done, however, the following problem arises: namely, in cases where a modulation scheme other than the maximum amplitude generating modulation scheme is used in the AGC diversion section, the difference between the maximum value of the received power and the saturation power (back-off) becomes large. In other words, it is preferable for the received power to be as high as possible in the range which does not cause saturation in order to enhance the signal receiving performance; however, in the abovementioned method, the received power in cases where a modulation scheme other than the maximum amplitude generating modulation scheme is used becomes lower than necessary.

Accordingly, one object of the present invention is to provide a wireless communication system, wireless communication apparatus, amplification factor determination method, and storage medium which make it possible to control the back-off in an appropriate manner in a wireless communication system in which AGC is performed in the AGC section, the results of this AGC are used in the AGC diversion section, and a modulation scheme which generates a transmission signal in which the maximum value of the amplitude differs from that of the modulation scheme of the AGC section is used in the AGC diversion section.

Means for Solving the Problem

The wireless communication system according to the present invention for solving the abovementioned problems includes a plurality of wireless communication apparatuses, wherein a first wireless communication apparatus includes first transmission signal generating means for generating a first transmission signal modulated using a first modulation scheme, second transmission signal generating means for generating a second transmission signal modulated using a second modulation scheme in which the maximum value of the amplitude of the transmission signal that is generated differs from that of the first modulation scheme, and transmitting means for transmitting the generated first transmission signal, and then the generated second transmission signal, to a second wireless communication apparatus; the second wireless communication apparatus includes receiving means for receiving the first transmission signal and second transmission signal transmitted by the transmitting means, and amplifying these signals at a given amplification factor; and the receiving means includes basic value determining means for determining a basic value used to determine the given amplification factor on the basis of the received power of the first transmission signal, correction data acquisition means for acquiring correction data for the basic value which is correction data that is determined on the basis of the amount of difference between the maximum values of the amplitudes of the transmission signals respectively generated using the first modulation scheme and the second modulation scheme, and amplification factor determining means for determining the given amplification factor for the second transmission signal on the basis of the determined basic value and the acquired correction data.

In this way, in a wireless communication system in which AGC is performed in the AGC section (section in which the first transmission signal is received), the results of this AGC are used in the AGC diversion section (section in which the second transmission signal is received), and a modulation scheme (second modulation scheme) which generates a transmission signal in which the maximum value of the amplitude differs from that of the modulation scheme of the AGC section (first modulation scheme) is used in this AGC diversion section, the amplification factor is determined on the basis of the amount of difference between the maximum values of the amplitudes of the transmission signals respectively generated using the first modulation scheme and second modulation scheme; accordingly, the back-off can be appropriately controlled.

Furthermore, in the abovementioned wireless communication system, the wireless communication system may perform multiplex communications by space division multiplexing and further includes spatial multiplexing degree acquisition means for acquiring the degree of spatial multiplexing of the signals transmitted by the transmitting means; and the correction data acquisition means may acquire the correction data determined also on the basis of the acquired degree of spatial multiplexing.

In a case where a spatial multiplexing scheme is used, the radio waves transmitted to other receivers, which are spatially multiplexed, are superimposed as noise; accordingly, as the degree of spatial multiplexing increases, the received power in the wireless communication apparatus on the receiving side tends to increase. In cases where there is a difference in amplitude between the first transmission signal and second transmission signal, this difference is made wider than when a spatial multiplexing scheme is not used.

In the configuration described above, the correction data is also determined on the basis of the degree of spatial multiplexing; accordingly, the back-off can also be appropriately controlled in cases where a spatial multiplexing scheme is used.

Furthermore, in this wireless communication system, the wireless communication system may further include correction data storage means for storing the correction data in correspondence with difference amount information, which indicates the amount of difference between the maximum values of the amplitudes of the transmission signals generated using the respective modulation schemes and the maximum value of the amplitude of the transmission signal generated using the reference modulation scheme determined by the wireless communication system, and with spatial multiplexing degree information indicating the degree of spatial multiplexing; and the correction data acquisition means acquires the correction data stored in correspondence with difference amount information, which indicates the amount of difference between the maximum value of the amplitude of the transmission signal generated using the second modulation scheme and the maximum value of the amplitude of the transmission signal generated using the first modulation scheme used as the reference modulation scheme, and with spatial multiplexing degree information indicating the acquired degree of spatial multiplexing.

Furthermore, the wireless communication apparatus according to the present invention includes receiving means for receiving a first transmission signal, which is generated by being modulated using a first modulation scheme and transmitted, and a second transmission signal, which is generated by being modulated using a second modulation scheme in which the maximum value of the amplitude of the transmission signal generated differs from that of the first modulation scheme, and which is transmitted following the first transmission signal, and amplifying these signals at a given amplification factor, wherein the receiving means includes basic value determining means for determining a basic value used to determine the given amplification factor on the basis of the received power of the first transmission signal, correction data acquisition means for acquiring correction data for the basic value, which is correction data that is determined on the basis of the amount of difference between the maximum values of the amplitudes of the transmission signals respectively generated using the first modulation scheme and the second modulation scheme, and amplification factor determining means for determining the given amplification factor for the second transmission signal on the basis of the determined basic value and the acquired correction data.

Furthermore, the amplification factor determination method according to the present invention includes a receiving step of receiving a first transmission signal, which is generated by being modulated using a first modulation scheme and transmitted, and a second transmission signal which is generated by being modulated using a second modulation scheme in which the maximum value of the amplitude of the transmission signal generated differs from that of the first modulation scheme, and which is transmitted following the first transmission signal, and amplifying these signals at a given amplification factor, wherein the receiving step further includes a basic value determining step of determining a basic value used to determine the given amplification factor on the basis of the received power of the first transmission signal, a correction data acquisition step of acquiring correction data for the basic value, which is correction data that is determined on the basis of the amount of difference between the maximum values of the amplitudes of the transmission signals respectively generated using the first modulation scheme and the second modulation scheme, and an amplification factor determining step of determining the given amplification factor for the second transmission signal on the basis of the determined basic value and the acquired correction data.

Furthermore, the storage medium according to the present invention stores a program for making a computer function as receiving means for receiving a first transmission signal, which is generated by being modulated using a first modulation scheme and transmitted, and a second transmission signal, which is generated by being modulated using a second modulation scheme in which the maximum value of the amplitude of the transmission signal generated differs from that of the first modulation scheme, and which is transmitted following the first transmission signal, and amplifying these signals at a given amplification factor, wherein the receiving means includes basic value determining means for determining a basic value used to determine the given amplification factor on the basis of the received power of the first transmission signal, correction data acquisition means for acquiring correction data for the basic value, which is correction data that is determined on the basis of the amount of difference between the maximum values of the amplitudes of the transmission signals respectively generated using the first modulation scheme and the second modulation scheme, and amplification factor determining means for determining the given amplification factor for the second transmission signal on the basis of the determined basic value and the acquired correction data.

BRIEF DESCRIPTION OF THE DRAWINGS

FIG. 5 is a diagram showing a correction data storage table according to an embodiment of the present invention; and FIG. 6 is a diagram showing a flow of processing according to an embodiment of the present invention.

BEST MODE FOR CARRYING OUT THE INVENTION

Embodiments of the present invention will be described with reference to the drawings.

Figure 1:
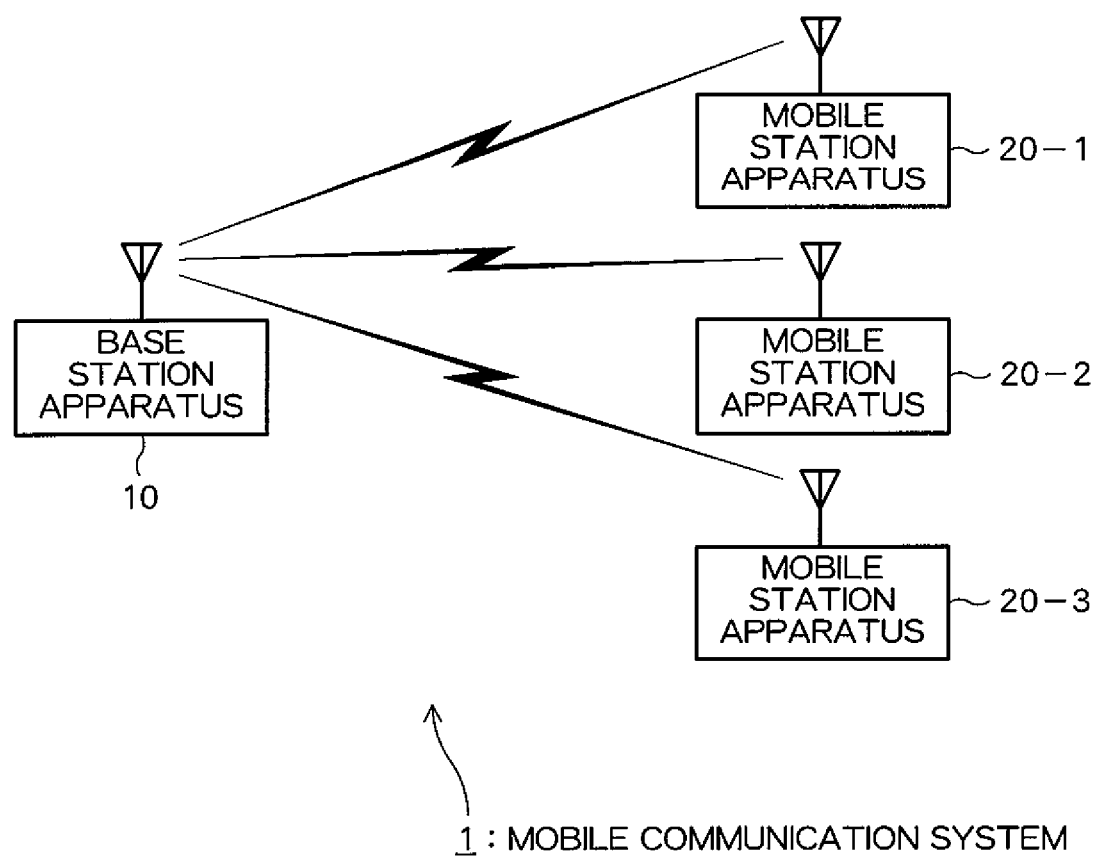
FIG. 1 is a diagram showing a system configuration of a mobile communication system according to an embodiment of the present invention.

FIG. 1 is a diagram showing a system configuration of a mobile communication system 1 according to the present embodiment. As shown in this diagram, a mobile communication system 1 includes a base station apparatus 10 and a plurality of mobile station apparatuses 20. The base station apparatus 10 and mobile station apparatuses 20 are all communication apparatuses having a CPU and a memory. The base station apparatus 10 and respective mobile station apparatuses 20 perform wireless communications.

The base station apparatus 10 and mobile station apparatuses 20 perform communications using the differential-absolute composite modulation scheme described above. Specifically, the mobile station apparatus 20 modulates information code using the differential-absolute composite modulation scheme, and acquires and transmits transmission signals. The base station apparatus 10 receives the transmission signals thus transmitted, amplifies these signals using an amplifier, and demodulates the signals. As described above, each of these transmission signals includes a differential encoding scheme section, followed by an absolute phase scheme section. In the present embodiment, the base station apparatus 10 determines the amplification factor of the amplifier in the absolute phase scheme section on the basis of the received power of the differential encoding scheme section, and the amount of difference in the maximum value of the amplitude of the transmission signals respectively generated using the modulation scheme of the differential encoding scheme section (hereafter referred to simply as the differential encoding scheme) and the modulation scheme of the absolute phase scheme section (hereafter referred to simply as the absolute phase scheme).

Figure 2:
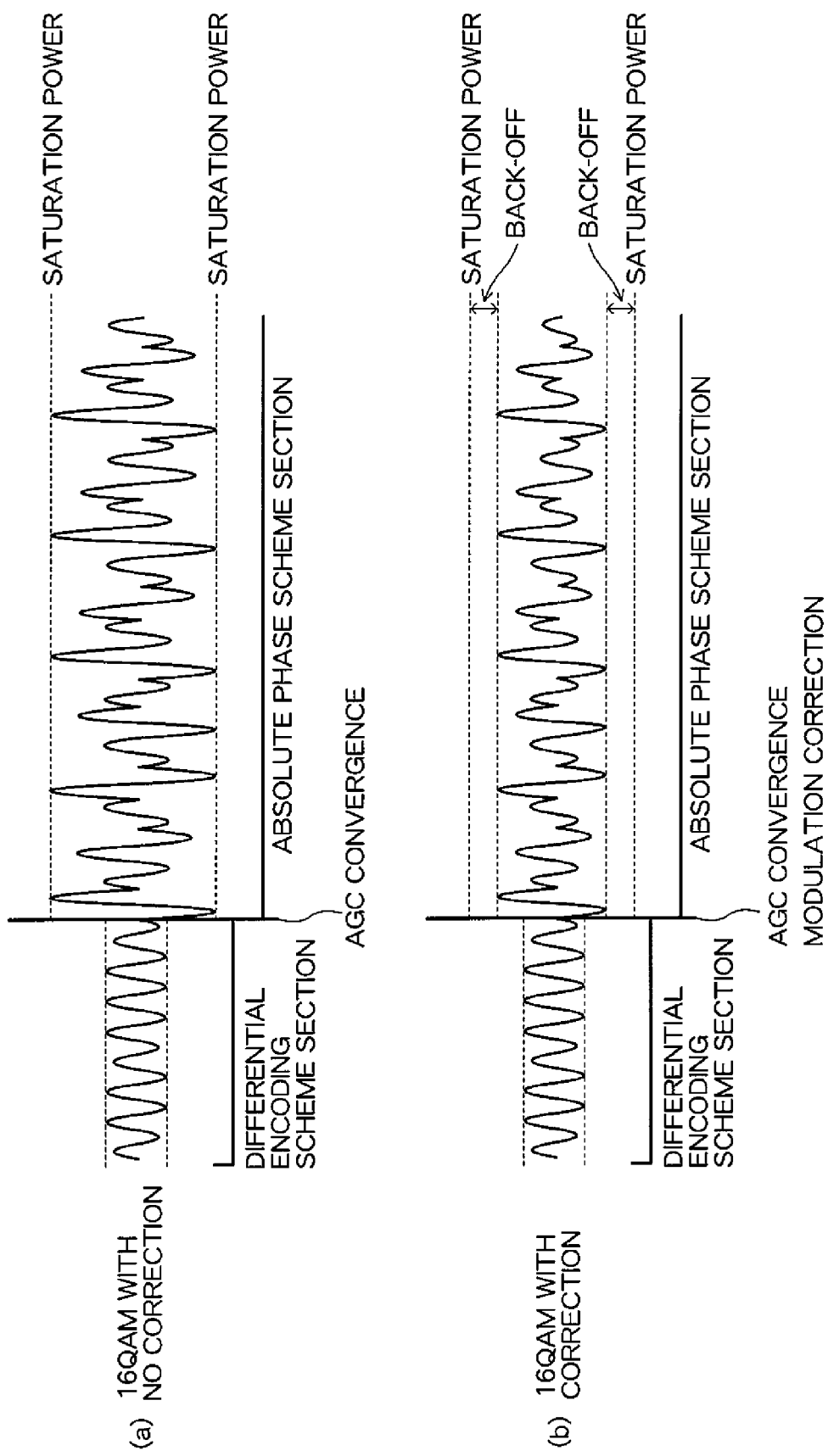
FIG. 2 shows explanatory diagrams of an operation of an amplifier according to an embodiment of the present invention, with FIG. 2A showing a case in which spatial multiplexing is not performed, and the correction of the present embodiment is not performed, and FIG. 2B showing a case in which spatial multiplexing is not performed, and the correction of the present embodiment is performed.

This amplification factor determination process will be described in concrete terms. FIG. 2 is a diagram showing an example of a signal received by the base station apparatus 10. In the received signal shown in this diagram, π/4QPSK is used as the differential encoding scheme, and 16QAM is used as the absolute phase scheme. In the differential encoding scheme section, the received power of the received signal is measured in order to determine the amplification factor of the amplifier in the absolute phase scheme section.

In the differential encoding scheme section, the basic value of the amplification factor of the amplifier in the absolute phase scheme section is determined on the basis of the measured received power. More concretely, the base station apparatus 10, while gradually varying the amplification factor so that the maximum value of the amplitude of the differential encoding scheme section is the maximum value of the minimum limit that allows appropriate reception of received signals of the differential encoding scheme section, causes this rate to converge on a single amplification factor, and takes this as the basic value. The processing performed in order to determine this basic value is called AGC.

There may be cases in which the maximum values of the amplitudes of the transmission signals respectively generated using the differential encoding scheme and absolute phase scheme differ from each other. For example, the maximum value of the amplitude of the transmission signal generated using 16QAM is approximately 1.34a, where "a" is the maximum value of the amplitude of the transmission signal generated using π/4QPSK. Accordingly, if the basic value is taken as the amplification factor of the amplifier in the absolute phase scheme section without modification, the maximum value of the amplitude in the absolute phase scheme section may exceed the saturation power, depending on the basic value. FIG. 2A shows an example in which the maximum value of the amplitude in the absolute phase scheme section is exactly equal to the saturation power.

In the present embodiment, a value obtained by correcting the basic value on the basis of the amount of difference between the maximum values of the amplitudes of the transmission signals respectively generated using the differential encoding scheme and absolute phase scheme is taken as the amplification factor of the amplifier in the absolute phase scheme section, so that a surplus can be provided even if the basic value fluctuates. The amount of this difference is 0.34a in the example of π/4QPSK and 16QAM.

FIG. 2B shows an example of the results obtained when the corrected basic value is taken as the amplification factor of the amplifier in the absolute phase scheme section in a received signal having the same waveform as FIG. 2A. As shown in this diagram, compared to FIG. 2A, a back-off can be ensured between the saturation power and the maximum value of the amplitude in the absolute phase scheme section in spite of the fact that the received signals are the same. By thus ensuring a back-off, the base station apparatus 10 prevents the received power from exceeding the saturation power as a result of small fluctuations.

Furthermore, the base station apparatus 10 includes an adaptive array antenna; the base station apparatus 10 and the respective mobile station apparatuses 20 perform communications by frequency division multiplexing and time division multiplexing, and perform communications by spatial multiplexing. Specifically, communications between a single base station apparatus 10 and a plurality of mobile station apparatuses 20 are performed at the same frequency and in the same time slot.

For example, in a case where the mobile station apparatus 20-1 and mobile station apparatus 20-2 are space division multiplexed, the base station apparatus 10 controls the antennas that make up the adaptive array antenna so that a null point of the directivity for the mobile station apparatus 20-1 (mobile station apparatus 20-2) is oriented in the direction in which the mobile station apparatus 20-2 (mobile station apparatus 20-1) is positioned. By doing this, it is possible to perform communications between a single base station apparatus 10 and a plurality of mobile station apparatuses 20 at the same frequency and in the same time slot. Below, furthermore, the number of mobile station apparatuses 20 that are space division multiplexed with a certain mobile station apparatus 20 (including this mobile station apparatus 20) will be referred to as the degree of spatial multiplexing of the mobile station apparatus 20.

The radio waves received by the base station apparatus 10 from one mobile station apparatus 20, even though a null point is oriented to the one mobile station apparatus 20 and the radio waves are negligible, constitute noise (interference waves) with respect to the radio waves received from the other mobile station apparatus 20. Furthermore, the radio waves received from respective mobile station apparatuses 20 that are spatially multiplexed show a mutual shift in phase due to the effects of fading and the like. Accordingly, the received power in the differential encoding scheme section is unstable (there are cases in which the power is canceled by noise, and cases in which the power is reinforced by noise), and there may be cases in which the peak power cannot be specified. Since the amplification factor is determined by the specified peak power in AGC, if the peak power cannot be specified, there may be cases in which the basic value determined by AGC is larger than necessary. The fluctuation of the basic value caused by noise increases with an increase in the degree of spatial multiplexing; in the present embodiment, therefore, the basic value is further corrected on the basis of the degree of spatial multiplexing of the mobile station apparatus 20 transmitting the received signal.

Figure 3:
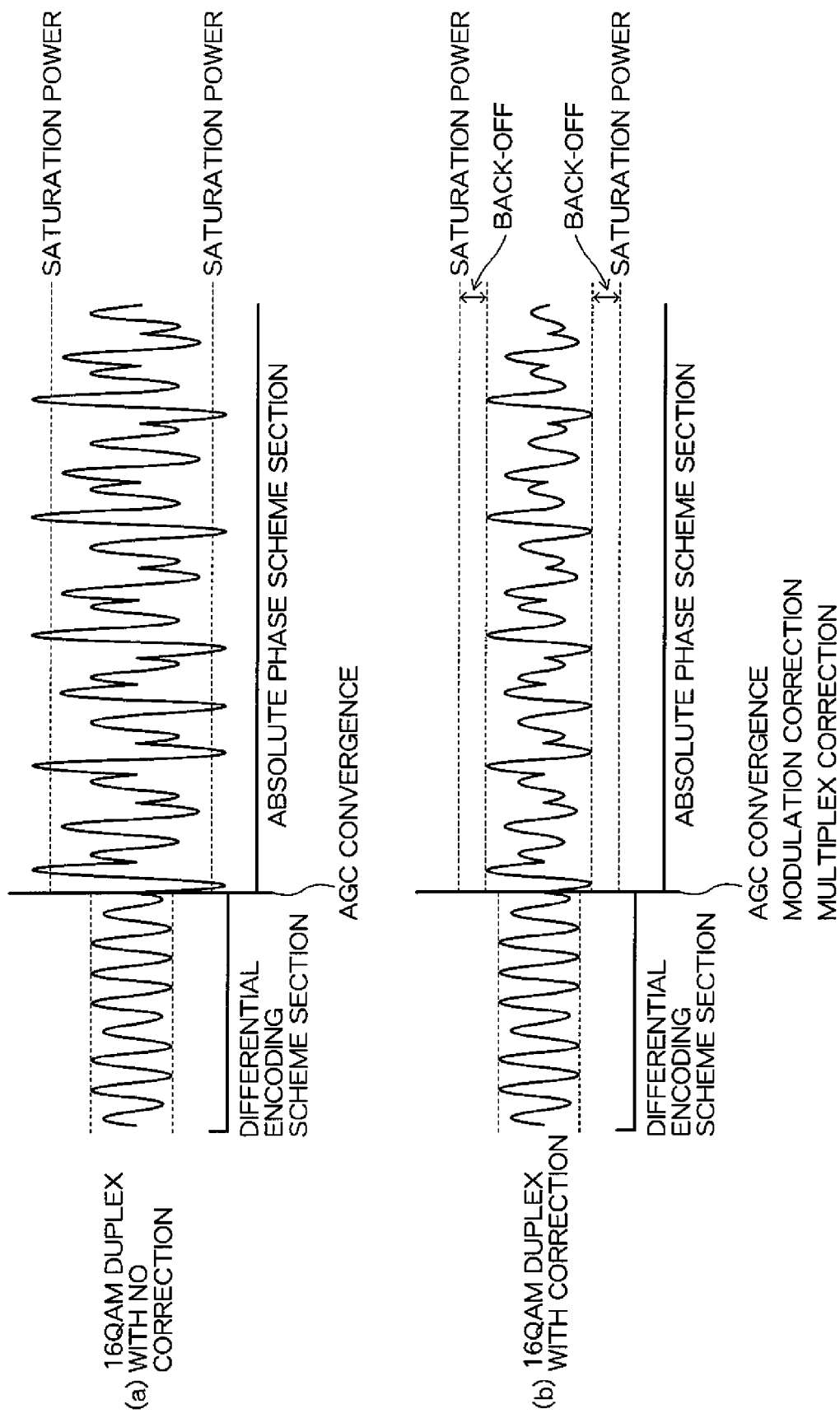
FIG. 3 shows explanatory diagrams of an operation of the amplifier according to an embodiment of the present invention, with FIG. 3A showing a case in which spatial multiplexing is not performed, and the correction of the present embodiment is performed, and FIG. 3B showing a case in which spatial multiplexing is performed, and the correction of the present embodiment is performed.

FIG. 3 is a diagram showing an example of a signal received by the base station apparatus 10 in a case where space division multiplexing is performed. FIG. 3A shows a received signal that differs from FIG. 2A only with regard to the presence or absence of space division multiplexing; the amplitude of the differential encoding scheme section is larger than in FIG. 2A. This indicates that the basic value is larger. Accordingly, a portion that exceeds the saturation power is generated in the absolute phase scheme section.

FIG. 3B shows an example of the results obtained when a basic value further corrected on the basis of the degree of spatial multiplexing of the mobile station apparatus 20 transmitting the received signal is taken as the amplification factor of the amplifier in the absolute phase scheme section in a received signal having the same waveform as in FIG. 3A. As shown in this diagram, compared to FIG. 3A, a back-off can be ensured between the saturation power and the maximum value of the amplitude in the absolute phase scheme section in spite of the fact that the degree of spatial multiplexing and the received signals are the same.

Below, the configuration of the mobile communication system 1 used to perform the functions described above will be described in detail.

Figure 4:
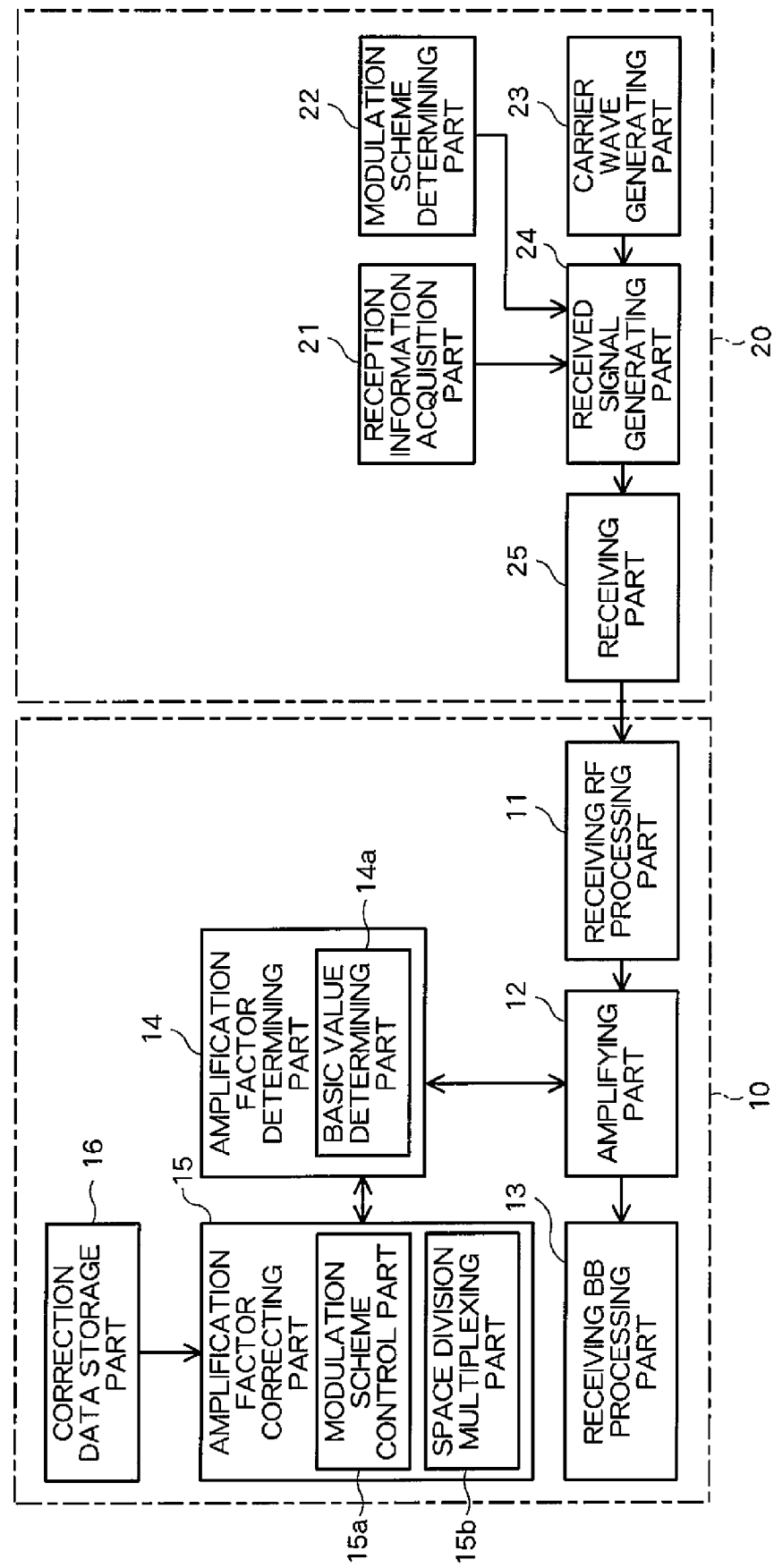
FIG. 4 is a diagram showing functional blocks of a mobile communication system according to an embodiment of the present invention.

FIG. 4 is a diagram showing functional blocks of the mobile communication system 1. As shown in this diagram, the base station apparatus 10 includes a receiving RF processing part 11, an amplifying part 12, a receiving BB processing part 13, an amplification factor determining part 14, an amplification factor correcting part 15, and a correction data storage part 16; and the mobile station apparatus 20 includes a transmission information acquisition part 21, a modulation scheme determining part 22, a carrier wave generating part 23, a transmission signal generating part 24, and a transmitting part 25. Furthermore, the amplification factor determining part 14 further includes a basic value determining part 14a, and the amplification factor correcting part 15 further includes a modulation scheme control part 15a and a space division multiplexing control part 15b.

The transmission information acquisition part 21 acquires an information code that is to be transmitted from a communication processing part not shown, and outputs this to the transmission signal generating part 24. This information code is constructed from a control bit sequence and a communication bit sequence in each time slot. Furthermore, some of the control bits form a differential encoding scheme section, and a portion of the remainder of the control bit sequence and the communication bit sequence, form an absolute phase scheme section.

The modulation scheme determining part 22 respectively determines the differential encoding scheme and the absolute phase scheme, and outputs these to the transmission signal generating part 24. Here, furthermore, it is assumed that the differential encoding scheme is a specified reference modulation scheme determined by the mobile communication system 1 (i.e., it is assumed that the differential encoding scheme does not vary), and it is assumed that the absolute phase scheme varies according to adaptive modulation (link adaptation).

The carrier wave generating part 23 generates a carrier wave, and outputs this to the transmission signal generating part 24.

The transmission signal generating part 24 generates a signal modulated using the differential encoding scheme input from the modulation scheme determining part 22 (a signal corresponding to the differential encoding scheme section) and a signal modulated using the absolute phase scheme input from the modulation scheme determining part 22 (a signal corresponding to the absolute phase scheme section), and outputs these signals to the transmitting part 25. More concretely, the transmission signal generating part 24 generates the abovementioned signals by modulating the carrier wave input from the carrier wave generating part 23 on the basis of the information code input from the transmission information acquisition part 21. In this modulation, the transmission signal generating part 24 uses the differential encoding scheme input from the modulation scheme determining part 22 for signals corresponding to the differential encoding scheme section, and uses the absolute phase scheme input from the modulation scheme determining part 22 for signals corresponding to the absolute phase scheme section.

The transmitting part 25 has antennas; this part transmits signals corresponding to the differential encoding scheme section generated by the transmission signal generating part 24 as radio signals, and then transmits signals corresponding to the absolute phase scheme section as radio signals, to the base station apparatus 10. More concretely, the transmitting part 25 generates a time slot containing the abovementioned signals, and transmits the generated time slots as radio signals. Signals corresponding to the differential encoding scheme section are contained in the headers of the time slot, and signals corresponding to the absolute phase scheme section are contained in the portion behind these signals.

The receiving RF processing part 11 also has antennas; this part receives the radio signals transmitted from the mobile station apparatuses 20, and outputs these signals to the amplifying part 12.

The amplifying part 12 has an amplifier such as a transistor, FET, or the like; this part amplifies the signals input from the receiving RF processing part 11 at an amplification factor determined by the amplification factor determining part 14 as will be described later, and outputs these signals to the receiving BB processing part 13.

The receiving BB processing part 13 converts the frequency of the signals input from the amplifying part 12 from the radio frequency to a baseband frequency, and inputs these signals into a communication processing part not shown. This communication processing part converts the input signals into an information code, and performs communication processing in accordance with this information code.

The basic value determining part 14a determines the basic value used in order to determine the amplification factor of the amplifying part 12 on the basis of the received power of the differential encoding scheme section in the radio signals received by the receiving RF processing part 11.

The modulation scheme control part 15a acquires the modulation scheme from the received differential encoding scheme section, acquires information indicating the modulation scheme of the absolute phase scheme section contained in the differential encoding scheme section, and acquires the modulation scheme of the absolute phase scheme section. Specifically, the modulation scheme control part 15a acquires the differential encoding scheme and the absolute phase scheme.

Furthermore, the space division multiplexing control part 15b acquires the degree of spatial multiplexing of the received signals. In concrete terms, a communication control part not shown controls the frequency and time slots used in communications with the respective mobile station apparatuses 20, and the space division multiplexing control part 15b acquires the degree of spatial multiplexing of the received signals from the information thus controlled.

The amplification factor correcting part 15 acquires correction data for the determined basic value, which is correction data that is determined on the basis of the amount of difference between the maximum values of the amplitudes of the transmission signals respectively generated using the acquired differential encoding scheme and acquired absolute phase scheme, and that is further determined on the basis of the acquired degree of spatial multiplexing.

The acquisition of correction data in this amplification factor correcting part 15 will be described more concretely. The correction data storage part 16 stores the correction data storage table shown in FIG. 5. This correction data storage table is a table that stores the correction data in correspondence with difference amount information indicating the amount of difference between the maximum value of the amplitude of the transmission signals generated using the absolute phase scheme and the maximum value of the amplitude of the transmission signals generated using the above-mentioned reference modulation scheme, and spatial multiplexing degree information indicating the degree of spatial multiplexing. More concretely, the correction data storage table stores information indicating the absolute phase scheme itself as the difference amount information. In FIG. 5, the modulation scheme shown on the vertical axis of the correction data storage table is the absolute phase scheme. Thus, the correction data storage table stores the correction data in correspondence with the absolute phase scheme and the degree of spatial multiplexing. For example, in a case where the absolute phase scheme is 16QAM and the degree of spatial multiplexing is 2 (SDMA duplex), the correction data is γ+α. Furthermore, in a case where the absolute phase scheme is 64QAM and the degree of spatial multiplexing is 3 (SDMA triplex), the correction data is η+β. Here, γ, η, α, and β are positive values. Furthermore, the relationships of η>γ and β>α are satisfied. Specifically, the correction data increases as the communication rate of the absolute phase scheme increases. Furthermore, the correction data increases as the degree of spatial multiplexing increases. Moreover, in cases where the differential encoding scheme varies, a correction data storage table is stored for each differential encoding scheme.

The amplification factor correcting part 15 first acquires the correction data storage table that is stored for the acquired differential encoding scheme. Next, the correction data that is stored in the correction data storage table in correspondence with the acquired absolute phase scheme and the acquired degree of spatial multiplexing is read out. Thus, the amplification factor correcting part 15 acquires the correction data.

The amplification factor determining part 14 corrects the basic value determined by the basic value determining part 14a on the basis of the correction data acquired by the amplification factor correcting part 15, and determines the corrected basic value as the amplification factor of the amplifying part 12 in the absolute phase scheme section. The amplifying part 12 performs amplification of the absolute phase scheme section at this determined amplification factor.

This determination will be described using a concrete example. For instance, in a case where the absolute phase scheme is 16QAM and the degree of spatial multiplexing is 2, the corrected basic value is B−(γ+α), where B is the basic value, and the determined amplification factor is smaller than the basic value. Accordingly, the base station apparatus 10 can appropriately ensure a back-off in the absolute phase scheme section.

The processing of the base station apparatus 10 described above will be described again in detail with reference to a process flowchart.

FIG. 6 is a diagram showing the flow of the processing of the base station apparatus 10. As shown in this diagram, the base station apparatus 10 first receives the first transmission signal (differential encoding scheme section) (S1). The base station apparatus 10 performs AGC using the received power of this first transmission signal, and determines the basic value of the amplification factor (S2). Furthermore, in parallel with the processing of S2, the base station apparatus 10 acquires the modulation scheme (absolute phase scheme) of the second transmission signal received following the first transmission signal, and the degree of spatial multiplexing (S3).

Next, the base station apparatus 10 acquires correction data on the basis of the modulation scheme of the first transmission signal, the modulation scheme of the second transmission signal, and the degree of spatial multiplexing (S4). Then, the base station apparatus corrects the basic value determined in S2 on the basis of the correction data acquired in S4 (S5).

Thus, in the present embodiment, in the wireless communication system in which AGC is performed in the modulation encoding scheme section, the results of this AGC are used in the absolute phase scheme section, and the absolute phase scheme which generates a transmission signal in which the maximum value of the amplitude differs from that of the modulation encoding scheme used in this absolute phase scheme section, the amplification factor is determined on the basis of the amount of difference between the maximum values of the amplitudes of the transmission signals respectively generated using the modulation encoding scheme and the absolute phase scheme; accordingly, the back-off in the absolute phase scheme section can be appropriately controlled.

Furthermore, the correction data is also determined on the basis of the degree of spatial multiplexing; accordingly, the back-off can be appropriately controlled even in cases where the spatial multiplexing scheme is used.

The present invention is not limited to the abovementioned embodiment. For example, in the abovementioned embodiment, amplification factor determination processing in the base station apparatus 10 is described; however, amplification factor determination processing in the mobile station apparatus 20 is similar. In this case, however, the mobile station apparatus 20 preferably receives the degree of spatial multiplexing from the base station apparatus 10.

The correction data in the abovementioned embodiment is data that is added to or subtracted from the basic value; however, it may be data that is multiplied or divided with respect to the basic value.

Furthermore, the present invention is not limited to mobile communication systems and differential-absolute composite modulation schemes; the present invention can be applied to any wireless communication system in which signals respectively modulated using the first modulation scheme and the second modulation scheme are received and transmitted in succession.

The invention claimed is:

1. A wireless communication system comprising a plurality of wireless communication apparatuses, wherein a first wireless communication apparatus comprises:
   first transmission signal generating means for generating a first transmission signal modulated using a first modulation scheme;
   second transmission signal generating means for generating a second transmission signal modulated using a second modulation scheme in which the maximum value of the amplitude of the transmission signal that is generated differs from that of the first modulation scheme; and
   transmitting means for transmitting the generated first transmission signal, and then the generated second transmission signal, to a second wireless communication apparatus;
   the second wireless communication apparatus comprises:
   receiving means for receiving the first transmission signal and second transmission signal transmitted by the transmitting means, and amplifying these signals at a given amplification factor; and
   the receiving means comprises:
   basic value determining means for determining a basic value used to determine the given amplification factor on the basis of the received power of the first transmission signal;
   correction data acquisition means for acquiring correction data for the basic value, which is correction data that is determined on the basis of the amount of difference between the maximum values of the amplitudes of the transmission signals respectively generated using the first modulation scheme and the second modulation scheme; and
   amplification factor determining means for determining the given amplification factor for the second transmission signal on the basis of the determined basic value and the acquired correction data.

2. The wireless communication system according to claim 1, wherein
   the wireless communication system performs multiplex communications by space division multiplexing and further comprises spatial multiplexing degree acquisition means for acquiring the degree of spatial multiplexing of the signals transmitted by the transmitting means; and
   the correction data acquisition means acquires the correction data determined also on the basis of the acquired degree of spatial multiplexing.

3. The wireless communication system according to claim 2, wherein:
   the wireless communication system further comprises correction data storage means for storing the correction data in correspondence with difference amount information, which indicates the amount of difference between the maximum values of the amplitudes of the transmission signals generated using the respective modulation schemes and the maximum value of the amplitude of the transmission signal generated using the reference modulation scheme determined by the wireless communication system, and with spatial multiplexing degree information indicating the degree of spatial multiplexing; and
   the correction data acquisition means acquires the correction data stored in correspondence with difference amount information, which indicates the amount of difference between the maximum value of the amplitude of the transmission signal generated using the second modulation scheme and the maximum value of the amplitude of the transmission signal generated using the first modulation scheme used as the reference modulation scheme, and with spatial multiplexing degree information indicating the acquired degree of spatial multiplexing.

4. A wireless communication apparatus comprising:
   receiving means for receiving a first transmission signal, which is generated by being modulated using a first modulation scheme and transmitted, and a second transmission signal, which is generated by being modulated using a second modulation scheme in which the maximum value of the amplitude of the transmission signal generated differs from that of the first modulation scheme, and which is transmitted following the first transmission signal, and amplifying these signals at a given amplification factor; wherein
   the receiving means comprises:
   basic value determining means for determining a basic value used to determine the given amplification factor on the basis of the received power of the first transmission signal;
   correction data acquisition means for acquiring correction data for the basic value, which is correction data that is determined on the basis of the amount of difference between the maximum values of the amplitudes of the transmission signals respectively generated using the first modulation scheme and the second modulation scheme; and
   amplification factor determining means for determining the given amplification factor for the second transmission signal on the basis of the determined basic value and the acquired correction data.

5. An amplification factor determination method comprising:
   a receiving step of receiving a first transmission signal, which is generated by being modulated using a first modulation scheme and transmitted, and a second transmission signal, which is generated by being modulated using a second modulation scheme in which the maximum value of the amplitude of the transmission signal generated differs from that of the first modulation scheme, and which is transmitted following the first transmission signal, and amplifying these signals at a given amplification factor; wherein the receiving step further comprises:

a basic value determining step of determining a basic value used to determine the given amplification factor on the basis of the received power of the first transmission signal;

a correction data acquisition step of acquiring correction data for the basic value, which is correction data that is determined on the basis of the amount of difference between the maximum values of the amplitudes of the transmission signals respectively generated using the first modulation scheme and the second modulation scheme; and an amplification factor determining step of determining the given amplification factor for the second transmission signal on the basis of the determined basic value and the acquired correction data.

6. A computer-readable storage medium storing a program for making a computer function as receiving means for receiving a first transmission signal, which is generated by being modulated using a first modulation scheme and transmitted, and a second transmission signal, which is generated by being modulated using a second modulation scheme in which the maximum value of the amplitude of the transmission signal generated differs from that of the first modulation scheme, and which is transmitted following the first transmission signal, and amplifying these signals at a given amplification factor; wherein the receiving means comprises:

basic value determining means for determining a basic value used to determine the given amplification factor on the basis of the received power of the first transmission signal;

correction data acquisition means for acquiring correction data for the basic value, which is correction data that is determined on the basis of the amount of difference between the maximum values of the amplitudes of the transmission signals respectively generated using the first modulation scheme and the second modulation scheme; and amplification factor determining means for determining the given amplification factor for the second transmission signal on the basis of the determined basic value and the acquired correction data.

* * * * *